United States Patent
Adams et al.

(10) Patent No.: US 6,931,573 B2
(45) Date of Patent: Aug. 16, 2005

(54) AUTOMATED AUDIT METHODOLOGY FOR DESIGN

(75) Inventors: Janice M. Adams, Jericho, VT (US); Donald L. Hubbard, Jericho, VT (US); Jeannie H. Panner, Underhill, VT (US); Bruce D. Raymond, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 696 days.

(21) Appl. No.: 09/928,604

(22) Filed: Aug. 13, 2001

(65) Prior Publication Data

US 2003/0037315 A1 Feb. 20, 2003

(51) Int. Cl.[7] .............................................. G06F 11/00
(52) U.S. Cl. ........................ 714/38; 714/39; 717/127
(58) Field of Search .................... 714/38, 39; 717/127; 702/119; 716/4, 5

(56) References Cited

U.S. PATENT DOCUMENTS

| | | | |
|---|---|---|---|
| 4,864,569 A | 9/1989 | DeLucia et al. | 714/38 |
| 5,590,049 A * | 12/1996 | Arora | 716/5 |
| 5,729,744 A | 3/1998 | Gerken et al. | 707/203 |
| 5,751,595 A * | 5/1998 | Beatty et al. | 716/5 |
| 5,754,441 A | 5/1998 | Tokunoh et al. | 716/11 |
| 5,901,154 A * | 5/1999 | Motohama et al. | 714/724 |
| 6,044,477 A | 3/2000 | Jordan et al. | 714/39 |
| 6,080,203 A | 6/2000 | Njinda et al. | 716/4 |
| 6,154,878 A | 11/2000 | Saboff | 717/11 |
| 6,581,192 B1 * | 6/2003 | Krishnamoorthy | 716/4 |
| 6,637,013 B1 * | 10/2003 | Li | 716/5 |
| 6,708,323 B2 * | 3/2004 | Ohta et al. | 716/19 |
| 2002/0138813 A1 * | 9/2002 | Teh et al. | 716/5 |
| 2002/0166100 A1 * | 11/2002 | Meding | 716/5 |
| 2003/0182645 A1 * | 9/2003 | Fairbanks | 716/5 |

OTHER PUBLICATIONS van den Hamer, P. and Treffers, M.A. "A Data Flow Based Architecture for CAD Frameworks", CFT–Autom., Eindhoven, Netherlands, 1990 IEEE INternational Conference on Computer–Aided Design. Digets of Technical Papers, pp. 482–485.

* cited by examiner

*Primary Examiner*—Robert Beausoliel
*Assistant Examiner*—Christopher McCarthy
(74) *Attorney, Agent, or Firm*—McGinn & Gibb, PLLC; Richard M. Kotulak, Esq.

(57) ABSTRACT

A method for design auditing by automating ways of auditing data produced by process steps is disclosed. The invention automates the process of auditing to account for complex methodology conditions. It also automates auditing of values of data produced by methodology steps. The invention provides a means of grouping task and information within a program and of preserving parent-child relationships.

8 Claims, 6 Drawing Sheets

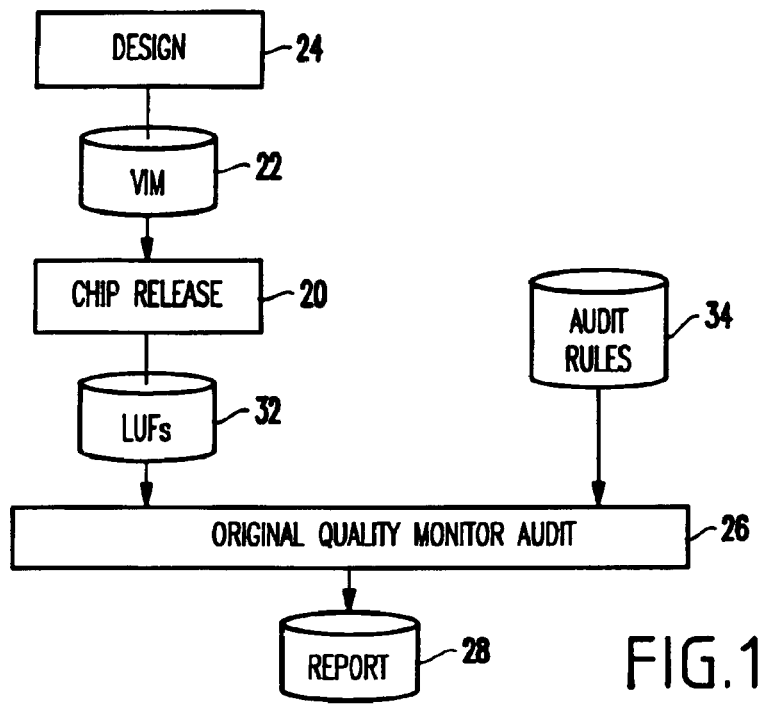

FIG.1

```
PROGRAM Chip_Edit bin/Chip_Edit 01/04/17 09:36:02 01/04/30 15:09:36
OBJECT  txplus 0101111714361900
TASK Chip_Edit_net_short 0
TASK Chip_Edit_net_space 0
TASK Chip_Edit_net_loop 0
TASK Chip_Edit_net_open 0
TASK Chip_Edit_net_antenna 0
TASK Chip_Edit_net_same_intersection 0
TASK Chip_Edit_net_softpin 0
TASK Chip_Edit_net_electromigration 0
TASK Chip_Edit_net_pin_blocked 0
TASK Chip_Edit_net_same_adj 0
TASK Chip_Edit_net_wire_constraints 0
TASK Chip_Edit_place_unplaced 0
TASK Chip_Edit_place_overlap 0
TASK Chip_Edit_place_orientation 0
TASK Chip_Edit_place_bookclass 0
TASK Chip_Edit_place_bookpwrblk 0
*CHECKSUM=3112929835
```

FIG.2

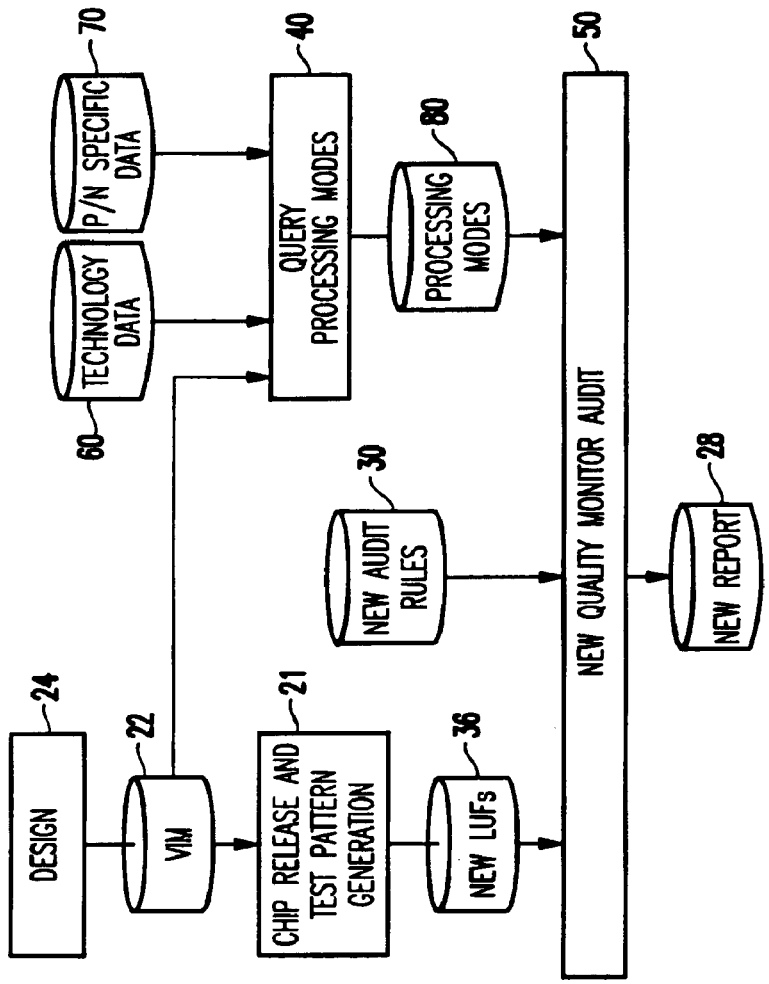

FIG.4

```
PROGRAM Chip_Edit Chip_Edit *
PROGRAM ElectricalRulesCheck ERCMain *
PROGRAM FillerCellCheck FCCMain *
. . .
TASK Chip_Edit_net_antenna 0
TASK Chip_Edit_net_electromigration 0
TASK Chip_Edit_net_loop 0
TASK Chip_Edit_net_open 0
TASK Chip_Edit_net_pin_blocked 12
TASK Chip_Edit_net_same_adj 0
TASK Chip_Edit_net_same_intersection 0
TASK Chip_Edit_net_short 0
TASK Chip_Edit_net_softpin 0
TASK Chip_Edit_net_space 0
TASK Chip_Edit_net_wire_constraints 0
TASK Chip_Edit_place_bookclass 0
TASK Chip_Edit_place_bookpwrblk 0
TASK Chip_Edit_place_orientation 0
TASK Chip_Edit_place_overlap 0
TASK Chip_Edit_place_unplaced 0
. . .
TASK ERC 0
TASK FCC 0
```

FIG.3

```
PROGRAM TESTBENCH 0 0 0 00/05/10 20:02:39
*
OBJECT FGACHIP 010010416364000
*
OBJECT CHIP_STRUC 010010416364000
TASK MODEL_IMPORT 0
TASK CHECK_IMPORT_TIEX 0
INFO EXCLUDED_ATTRIBUTES PERF,REPOWER,PINSWAP,M062
*
OBJECT CHIP_GLOBAL
TASK CHK_ALL_MACROS_TESTED 2
INFO TEST_COVERAGE_Module_DYNAMIC 89.911095
INFO TEST_COVERAGE_Wafer_STATIC 98.637550
INFO PART_NUMBER 06K6022
*
OBJECT TESTMODE_LOGIC_ACH
TASK GEN_TSECT_LOGIC 0
TASK GEN_TSECT_LOGIC_WRP 4
TASK CHK_FLAG_OVERRIDE 0
TASK CHK_TSV_SUCCESSFUL 0
INFO BDYSCAN INT
INFO TF_PIN_ATTRIBUTE TB_LOGIC_ACH,TB_WRP_AC
INFO TDR LLCCwrp
*
OBJECT TESTMODE_IOWRAP_FCH
TASK GEN_TSECT_IOWRAP 0
TASK GEN_TSECT_IOWRAP_2xLOGn 0
TASK CHK_FLAG_OVERRIDE 0
TASK CHK_TSV_SUCCESSFUL 0
INFO BDYSCAN EXT
INFO TF_PIN_ATTRIBUTE
TB_IOWRAP_FCH,TB_IOWRAP,TB_OFLAG,TB_KFLAG
INFO TDR A6671w
```

FIG.5

```
PROGRAM TESTBENCH 0 0 0 REQUIRED='FCH & TMD'
*
OBJECT CHIP_STRUC
TASK MODEL_IMPORT 0
TASK CHECK_IMPORT_TIEX 0
INFO EXCLUDED_ATTRIBUTES   BTV_DCS,BTV_TDS PROHIBITED
INFO EXCLUDED_ATTRIBUTES      OPTIONAL
*
OBJECT CHIP_GLOBAL
TASK CHK_ALL_MACROS_TESTED 2
INFO TEST_COVERAGE_Wafer_STATIC >=90
INFO TEST_COVERAGE_Module_DYNAMIC >=90 REQUIRED=AC
PROHIBITED=!AC
INFO PART_NUMBER
*
OBJECT TESTMODE_LOGIC_ACH REQUIRED=AC PROHIBITED=!AC
TASK GEN_TSECT_LOGIC 4 OPTIONAL
TASK GEN_TSECT_LOGIC_WRP 4
TASK CHK_FLAG_OVERRIDE 0
TASK CHK_TSV_SUCCESSFUL 0
INFO BDYSCAN INT
INFO TF_PIN_ATTRIBUTE TB_LOGIC_ACH,TB_WRP_AC
INFO TDR LLCCwrp
*
OBJECT TESTMODE_IOWRAP_FCH
TASK GEN_TSECT_IOWRAP 4
TASK GEN_TSECT_IOWRAP_2xLOGn 4 OPTIONAL
TASK CHK_FLAG_OVERRIDE 0
TASK CHK_TSV_SUCCESSFUL 0
INFO BDYSCAN INT PROHIBITED
INFO BDYSCAN EXT
INFO TF_PIN_ATTRIBUTE TB_IOWRAP_FCH,TB_IOWRAP,TB_OFLAG,TB_KFLAG
INFO TDR A6671w
```

FIG.6

| RECORD TYPE | REQUIRED | OPTIONAL | PROHIBITED |
|---|---|---|---|
| PROGRAM | This PROGRAM must be present in the LUF and all OBJECT, TASK and INFO records for this PROGRAM are processed. All of these records whose own conditions are true must "pass". | If this PROGRAM is present in the LUF, all OBJECT, TASK and INFO records for this PROGRAM are processed. All of these records whose own conditions are true must "pass". | If this PROGRAM is present in the LUF, a failing error message is written. |
| OBJECT | This OBJECT must be present in the LUF for the PROGRAM, and all TASK and INFO records for this OBJECT are processed. All of these records whose own conditions are true must "pass". | If this OBJECT is present in the LUF for the PROGRAM, and all TASK and INFO records for this OBJECT are processed. All of these records whose own conditions are true must "pass". | If this OBJECT is present in the LUF for the PROGRAM, a failing error message is written. |
| TASK | This TASK must be present in the LUF for the OBJECT and PROGRAM, with a return code less than or equal to the maximum specified code. | If this TASK is present in the LUF for the OBJECT and PROGRAM, its return code must be less than or equal to the maximum specified code. | If this TASK is present in the LUF for the OBJECT and PROGRAM, a failing error message is written, regardless of whether the completion code is <= the max allowed value. |
| INFO | This INFO must be present in the LUF for the OBJECT and PROGRAM, and the value in the LUF must match the value in the audit rule. | If this INFO is present in the LUF for the OBJECT and PROGRAM, a numeric value in audit rule must match the numeric value in the LUF. If there is no value in the audit rule, there are no error messages. In the case of a character value in the audit rule, there is no message if that value is present or missing in the LUF. | If this INFO is present in the LUF for the OBJECT and PROGRAM, and no value or a numeric value is given on the INFO, a failing message is written regardless of whether the value matches or not. If a character value is given on the INFO, the error message is only written if the value matches as well as the name. |

FIG.7

AUTOMATED AUDIT METHODOLOGY FOR DESIGN

BACKGROUND OF THE INVENTION

1. Field of the Invention

The present invention generally relates to a method for design auditing by automating ways of auditing data produced by process steps.

2. Description of the Related Art

Since the beginning of design and manufacturing of simple chips and higher level assemblies, it has been important to ensure the correct execution of various programs in the process, use of the correct version of technology data elements, and consistency of design data in some specific applications. Errors could result in incorrect design, build, or test of the product. The first example of an automatic system to provide this was developed by IBM in the 1970s and is described in a paper by P. Case et al., "Design Automation in IBM," IBM Journal of Research and Development, volume 25, number 5, pages 631–646, September 1981. This host-based system had a framework and an executive program tracking activity by other applications which stored audit records in a design database. It also had an audit rule to list valid technology rule and program levels and required completion codes for applications. There was an AUDIT function which checked all of the audit records against the audit rule and an audit trail which could be included on the release interface to manufacturing. The system handled design level tracking and provided some application sequencing control.

When workstations replaced host computer systems for design, it was necessary to develop a workstation-based system to replace the host-based system. At the same time, certain other needed features were added including a method of operating without requiring a framework and use of a new human-readable data model and audit files. FIG. 1 shows a portion of a conventional workstation system used to audit a product being designed. This process is not necessarily prior art and is not generally known to those ordinarily skilled in the art at the time of filing the patent application. The design process 24 uses the VLSI InCore (VIM) 22 containing netlist and physical design data as its design data model. Chip release steps 20 (various checking programs and data generation programs) produce an audit trail as "library usage files" (LUFs) 32. The technology developers provide audit rules 34 which contain correct levels of technology rules and required applications and tasks with required completion codes. The Quality Monitor Audit program 26 reads the LUFs and the audit rules and produces an output audit report 29 indicating whether the design passes the audit. The audit rules and LUFs (ascii files) are check-summed to guarantee file integrity.

The methodology portion of the LUF 32 for a program gives information on the program itself, the name of the data object (e.g., chip name) operated on, and results of tasks performed during program execution. The methodology LUF statement-types include:

PROGRAM pgmName executableName moduleDate moduleTime runDate runTime
OBJECT objectName level
TASK taskName completionCode The parameters on the PROGRAM statement include name of the program (pgmName), name of the code executable (executableName, including path name if possible), compile date of program executable (moduleDate—yy/mm/dd), compile time of program executable (moduleTime—hh:mm:ss), date the program was run (runDate—yy/mm/dd), and time the program was run (runTime—hh:mm:ss).

The parameters on the OBJECT statement include name of the entity (chip or macro) the program is running on (objectName) and the date/time stamp of the entity (level). (The format of the date/time is 0CYYDDDHHMMSS00 where C is the century: 0=19 1=20). The level is used for design data consistency checking external to QM.

The parameters on the TASK statement include the name of the TASK performed (taskName) and the completion code of the TASK (completionCode: 0=success, 4=warning message was issued, 8=error, 12=task was not run or was run on partial data, 16=program did not complete).

FIG. 2 shows the methodology portion of an original LUF. This is the audit trail produced by the VIM chip layout checking program. The PROGRAM statement says that the program name is ChipEdit, the executable is bin/ChipEdit, executable compile date is 2001 Apr. 17, executable compile time is 09:36:02, run date is 2001 Apr. 30, and run time is 15:09:36. There is only one OBJECT statement and it says the program was run on the chip named txplus, which had a time/date stamp 010111714361900. The program has a number of TASKs to be run on every chip. The first TASK is a check to detect nets shorted together (Chip_Edit_net_short) and it was successfully executed (completion code was 0), indicating no nets were shorted. Other tasks included checks for spacing, loops, opens, and other chip layout errors.

To provide PROGRAM and TASK auditing capability, the format of the Audit Rule statements is as follows:

PROGRAM <pgmName> <executableName> <moduleDate> <moduleTime>
TASK <taskName> <maxCompletionCodeAllowed>

The parameters of the PROGRAM have the same meaning as defined above for the LUF. It may be desirable not to audit moduleDate and moduleTime for a program, and in that case the audit rule will have an asterisk after the executableName. The parameters of the TASK statement include the maximum completion code (highest integer) allowed for a task for acceptance for manufacturing (maxCompletionCodeAllowed). This completion code is defined according to the same scheme as used for the LUF.

FIG. 3 shows a portion of an original AUDIT Rule. Note that an ascending alphabetic sort has been done on the fields of each statement, resulting in all the PROGRAM statements being grouped together and all the TASK statements being grouped together. The first PROGRAM statement listed says that the Chip_Edit program name has an executable named Chip_Edit and there is no requirement to audit for module date and module time. The eighth TASK listed is the statement for the Chip_Edit net short check (Chip_Edit_net_short) and it has a maximum allowed completion code of 0 (success is required). The audit rule shows other PROGRAMs and their TASKs, all sorted alphabetically. This loses the parent-child relationships and places a requirement on the TASKs to have unique names in the audit rule and also in the audit system. Also, since only one OBJECT statement is supported in the LUF, the audit rule does not contain any OBJECT statement. All PROGRAMs and TASKs listed in the Audit Rule are assumed to be required to be listed in the LUF.

The QM 26 processes a LUF 32 by reading a record at a time, looking for a record in the audit rule with a matching record type (field 1) and record name (field 2), checking subsequent fields in the record as required by the record type, and reporting an error if a match could not be found or if an error condition was present in the LUF.

This approach worked well for the original simple application auditing requirements. However, the inventors discovered that it did not work for more complex applications and methodologies. An analysis of the test generation process showed that the application is executed in major unique groupings of TASKs. A TASK might have the same name between such groupings. It was important to preserve these parent-child relationships while auditing. Also, a method was needed to report new data information in the LUF and to audit for its values against legal values described in the audit rule. Furthermore, complex conditions existed as to whether PROGRAMs, TASKs, groupings of TASKs, and the new information statements were required, optional, or prohibited according to global conditions of the part number being processed. There was no way to determine these conditions for a part number and audit whether the correct processing had occurred. Without these new capabilities, it was impossible to ensure that correct test methodology had been followed.

Similarly, the layout methodology became more complex to handle methodology differences. For example, the area array footprint of flip-chip solder bumps supports placement of I/O circuits internal to the die and requires additional power routing for them. This means that the checking program must successfully execute additional TASKs in this case but must not attempt these TASKs in the case of a peripheral I/O image.

In view of these requirements, the original audit capability shown in FIG. 1 required major improvements. An automated solution was still required to eliminate human error and achieve product delivery times previously committed to customers.

SUMMARY OF THE INVENTION

In view of the foregoing and other problems, disadvantages, and drawbacks of prior quality monitoring auditing methods in handling complex methodology requirements, the present invention has been devised, and it is an object of the present invention to provide a method for enhanced automated auditing procedures for a product, which is particularly applicable to the production of integrated circuits.

To attain the object suggested above, there is provided, according to one aspect of the invention an automated process of auditing to account for complex methodology conditions of a product (IC). The invention also automates auditing values of data produced by methodology steps. The invention also provides a means of grouping task and information within a program and of preserving parent-child relationships. The invention is easily applied to application specific integrated circuits (ASIC)designs, but could be applied to other similar types of methodologies.

Thus, one object of the invention is to provide a method for auditing a design process that includes producing library usage files for a plurality of steps in a design process using design data; determining processing modes for the design process using the design data and technology data; performing an audit by reading the library usage files, the processing modes, and audit rules into the quality monitor program; and producing a report of errors in the library usage files based on the audit rules and processing modes. The library usage files and audit rules include a plurality of OBJECT statements for a PROGRAM organized in a parent-child relationship where the PROGRAM is the parent and the OBJECTs are the children. The OBJECT statement can be associated with related INFO and TASK statements in a parent-child relationship, where the OBJECT is the parent of the associated INFOs and TASKs statements. The INFO statements increase the reporting ability of the quality monitor program because INFO statements include values to be checked by the quality monitor program during the audit. The audit rules include value checking expressions to be used by the quality monitor program during the audit. The audit rules also include conditions to be used in checking all the LUF statements by the quality monitor. The quality monitor program reads the global processing modes and checks all the LUF statements by using the conditions in the audit rules.

Advantages of the invention include that the invention can identify methodology differences as processing modes and describe these through a statement in a file (control file for QM application). The method of the invention provides an automated method to query design and technology data to identify processing modes used for a part number (query program). In addition, the method can associate general conditions (REQUIRED, OPTIONAL, PROHIBITED) and particular processing modes with methodology items (PROGRAMs, OBJECTs, TASKs, and INFOs) and describe these as additions to an existing file (audit rule condition additions for examining the LUFs). The method of the invention can associate numeric, character, or no values with an INFO item and describe these as additions to an existing file (audit rule INFO values). The automated method of the invention can provide conditional checking of the part number audit trail (LUFs) using processing modes for the part number and technology audit rules coded according to general conditions and technology processing modes (QM conditional checking). Additionally, the invention can provide an automated method for value checking of items (INFOs) in the part number audit trail (LUFs) using technology audit rules coded with character, numeric, or no values to be checked against (QM value checking).

BRIEF DESCRIPTION OF THE DRAWINGS

The foregoing and other objects, aspects and advantages will be better understood from the following detailed description of a preferred embodiment(s) of the invention with reference to the drawings, in which:

FIG. 1 shows one original quality monitoring audit process

FIG. 2 shows an original LUF for one PROGRAM.

FIG. 3 shows a portion of an original audit rule to support audit of the LUF in FIG. 2 and others.

FIG. 4 shows the quality monitor auditing process of the invention.

FIG. 5 shows a portion of a TestBench LUF.

FIG. 6 shows a portion of an exemplary TestBench audit rule for the process shown in FIG. 4.

FIG. 7 shows a table of audit rule conditions for the 4 record types and the actions taken by the new Quality Monitor audit in each case.

DETAILED DESCRIPTION OF PREFERRED EMBODIMENTS OF THE INVENTION

Figure 8:
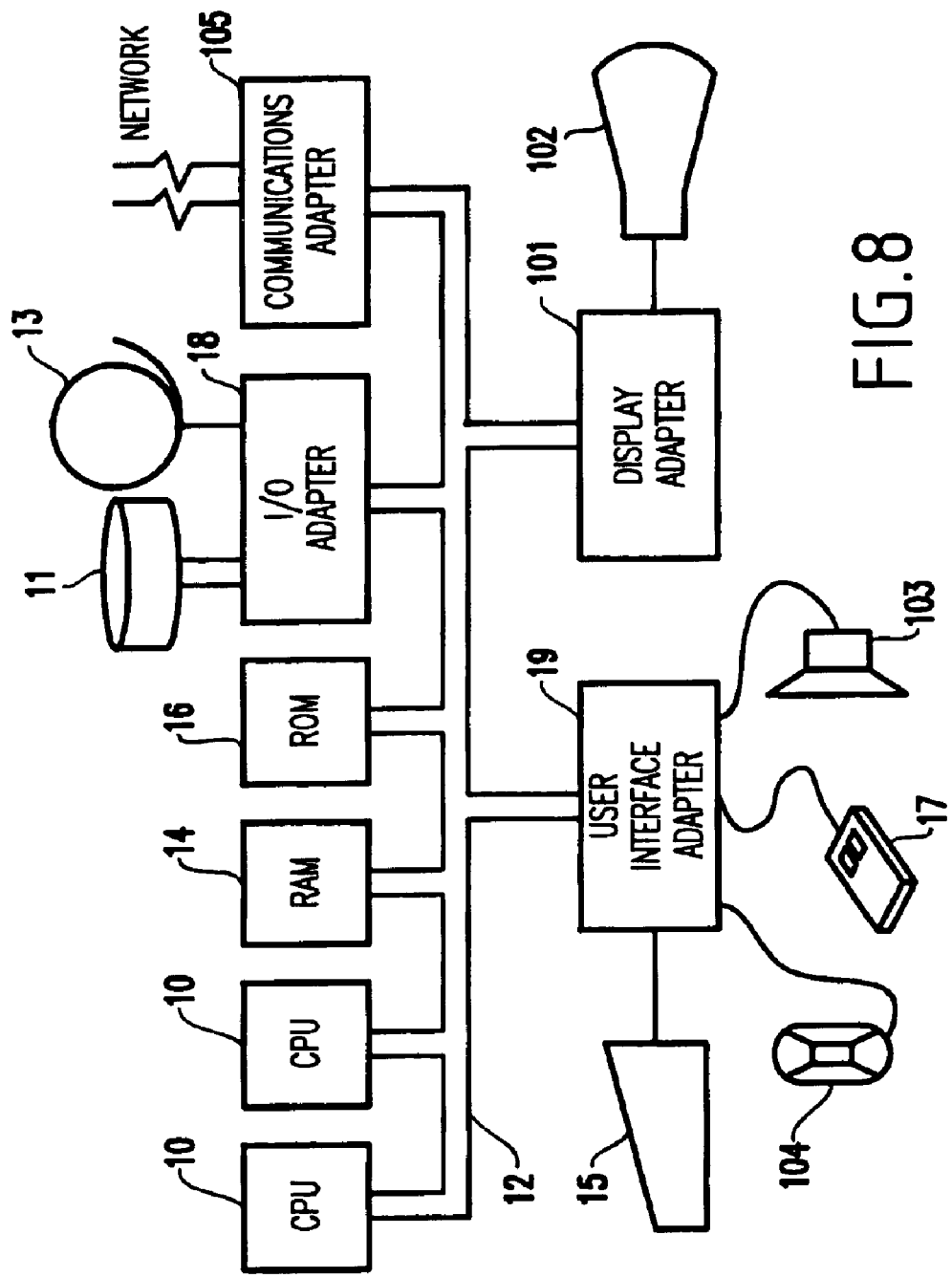
FIG. 8 shows a typical computer system environment for running the invention.

As discussed above, the invention automates the process of auditing programs to handle complex methodology situations. One embodiment of the invention is shown in a generalized exemplary form in FIG. 4.

The invention can be implemented in any combination using standard programming and/or engineering techniques using computer programming software, firmware, hardware or any combination or subcombination thereof Any such resulting program(s), having computer readable program code, may be embodied or provided within one or more computers readable or usable media such as fixed (hard) drives, disk, diskettes, optical disks, magnetic tape, semiconductor memories such as read-only memory (ROM), etc., or any transmitting/receiving medium such as the Internet or other communication network or link, thereby making a computer program product, i.e., an article of manufacture, according to the invention. The article of manufacture containing the computer programming code may be made and/or used by executing the code directly from one medium, by copying the code from one medium to another medium, or by transmitting the code over a network.

FIG. 4 shows the addition of test pattern generation to the supported applications 21 generating LUFs. The LUF 36 and audit rule 30 formats have been enhanced. The query processing modes 40 provide the enhanced QM 50 with global processing modes 80 for the design. The new enhanced QM audit program 50 reads the processing modes 80, the enhanced audit rules 30, and the LUFs 36 output by the chip release and test pattern generation programs 21. The invention then automatically performs the audit of the part_number and outputs the audit report 29 of failing aspects of the design. QM reports in the order it finds errors in the LUF, with messages appropriate to each statement type. It then reports anything which is required in the audit rule but is missing in the LUF. A return code of 0 indicates success, with a return code greater than 0 indicating failure. Failure means that the design must be fixed by the designers or a step such as Test Pattern Generation must be rerun correctly. Then a re-audit by QM must occur prior to proceeding to manufacturing.

With reference to FIG. 4, it was necessary to enhance the LUF format to support the new capabilities of complex applications and methodologies. A new statement type, the INFO statement, was added to provide a general mechanism for a program to report interesting data which could need value checking. It has a field to identify the type of data item (infoName) and a field for its value.

Next, the OBJECT statement was extended to allow grouping of related TASK and INFO statements. The OBJECT is now a generalized data object: the chip name or macro, a group of operations and information associated with a phase of the program execution, or any other data object meaningful to the program. The "level" parameter is not audited and is generally included only on OBJECTs for which consistency checking external to QM is desired. Parent-child relationships exist between a PROGRAM and its OBJECTs, and also between an OBJECT and its TASKs and INFOs.

The following summarizes the LUF 36 methodology statement-types now to be supported:
PROGRAM pgmName executable Name moduleData moduleTime runDate runTime
OBJECT objectName level
TASK taskName completionCode
INFO infoName value An example of selected portions of a LUF using the new features 36 is shown in FIG. 5. This LUF was produced for a part_number (chip design) that requires AC test and uses a die/package requiring the flip-chip high-pin-count test methodology. The tool which produced this LUF is a commercially available tool known as "TestBench", made by International Business Machines Corporation of Armonk, N.Y.

The LUF of FIG. 5 shows multiple (five) OBJECT statements. The first OBJECT (FGACHIP) refers to the chip entity, as in the original LUF definition. The other OBJECT statements represent phases of program execution or other data objects of interest to the program. The second OBJECT (CHIP_STRUC) represents the import of the entire chip design model into the application. The fourth (TESTMODE_LOGIC_ACH) represents the checking, test section generation, and special information associated with AC test generation for the internal logic portion of this high-pin-count chip design. Note that the same TASK name (CHK_FLAG_OVERRIDE) is listed under both of the last two OBJECTs, showing the need for preserving parent-child relationships in the audit rule.

The LUF of FIG. 5 also shows the use of many INFO statements. The 3 INFO statements listed under the OBJECT CHIP_GLOBAL give test coverage information and the chip part number. The last INFO statement in FIG. 5 gives the technology "tester description rule" (TDR) used during the test generation for its OBJECT.

With reference to FIG. 4, it was necessary to also enhance the audit rule 30 format to support the new capabilities. A new statement type, the INFO statement, was added to provide a general mechanism to check LUF INFO statement values. It has a field to identify the type of data item (infoName) and a field for specification of value checking to be performed. Also, the OBJECT statement type appears for the first time in the Audit Rule. Lastly, the 4 statement types shown below now are permitted to have conditions specified on them. The organization of the audit rule now must reflect the parent-child relationships expected in the LUF: PROGRAMs own OBJECTs, and OBJECTs own TASKs and INFOs. It is desirable for the audit rule to be as similar to the LUF in appearance and contents to make the manual maintenance of the audit rule easier and to improve readability. The following summarizes the enhanced audit rule 30 methodology statement-types now to be supported:
PROGRAM <pgmName> <executableName> <moduleDate> <moduleTime> <conditions>
OBJECT <objectName> <conditions>
TASK <taskName> <maxCompletionCodeAllowed> <conditions>
INFO <infoName> <valueChk> <conditions>

An example of selected portions of an audit rule using the new features 30 is shown in FIG. 6. This corresponds to the LUF example above in FIG. 5. With the invention, parent-child organization of the audit rule is similar to the LUF and "conditions" are used on some PROGRAM, OBJECT, TASK and INFO statements. For example, the PROGRAM statement: PROGRAM TESTBENCH 0 0 0 REQUIRED= 'FCH & TMD' says that all statements belonging to this PROGRAM are required for the flip-chip high-pin-count (FCH) test methodology when doing test generation (TMD), unless overridden by child statements. This dictates what the LUF must look like for this test methodology. Note also the many INFO statements, most with value checking expressions. An example under OBJECT TESTMODE_LOGIC_ACH is: INFO TDR LLCCwrp, which lists the tester description rule (TDR) value (LLCCwrp) to be used for that mode of test generation. This effectively applies the manufacturing tester constraints to the software test generation process.

Also with reference to FIG. 4, a new step 40 queries for processing modes which apply to the design, for use in the quality monitor (QM) audit 50. The query 40 reads technology data 60 such as tables defining methodology choices by die size and package and methodology choices based on cell types present in the ASIC. It also reads the design itself from the VIM 22. Finally, it can receive by manual entry additional part_number data 70 such as whether AC test is required for this part_number. The output of the query 40 is the list of processing modes 80 to be used to audit the part_number, which is stored in the QM control file. The control file keyword is "ProcessingModes" followed by one or more processing mode names separated by blanks. The record for the exemplary TestBench LUF and audit rule case is: ProcessingModes TMD FCH AC. This says that the part number is having test generation done (TMD) with flip-chip high-pin-count test methodology (FCH) and AC test methodology (AC).

A description of the detailed support of condition specification and checking within the audit system follows. The invention allows PROGRAM, OBJECT, TASK and INFO statements in the Audit Rule 30 to optionally have conditions specified on them. The conditions describe the circumstances under which that record should be checked by the Quality Monitor auditing program 50. The condition on a parent record (PROGRAM for OBJECT, and OBJECT for TASK and INFO) controls whether the child records are examined. The conditions have one or two parts. The first part of the "condition" specifies that: the item is required all the time or is required only under specified circumstances, the item is optional all the time or is optional only under specified circumstances, or the item is prohibited all the time or is prohibited only under specified circumstances.

The second part of the "condition" is optional and identifies the specific circumstances in terms of the processing modes on the part. The second part of the condition supports logical operations on processing modes, such as AND, OR, and NOT.

Within the Audit Rule 30, the type of condition is defined as one of the following: REQUIRED, OPTIONAL, PROHIBITED. If a condition is not given, the default is REQUIRED all the time. FIG. 7 describes what the conditions mean for each record type if the circumstances are omitted or evaluate to true. For example, referring to FIG. 7, if a PROGRAM statement is PROHIBITED by the audit rule, then if this PROGRAM statement is present in the LUF, a failing error message is written by QM. If a TASK is REQUIRED by the audit rule, this TASK must be present in the LUF for its parent OBJECT and PROGRAM, and the TASK must have a completion code less than or equal to the maximum allowed by the audit rule.

More than one of these conditions can be given on a statement. Each will be evaluated in turn and any one failure will generate an error message. If no equals sign "=" follows the condition, then the condition is true all the time. If an equals sign immediately follows the condition, then the specification of the circumstances under which the condition is true follows.

Referring to FIG. 6, the following statement under OBJECT TESTMODE_IOWRAP_FCH says that this task is required in the LUF and must have a maximum completion code less than or equal to four: TASK GEN_TSECT_IOWRAP 4 The following statement says that the OBJECT TESTMODE_LOGIC_ACH is required if AC test is being done on the part and prohibited otherwise. OBJECT TESTMODE_LOGIC_ACH REQUIRED=AC PROHIBITED=!AC.

The circumstances will be an expression containing some combination of processing modes, optionally separated by logical OR ("|") and logical AND ("&") operators, or prefixed by a logical NOT (!) operator. If the expression evaluates to true, the condition is true for this chip. Parentheses and nested parentheses can be used to force the order of evaluation of the expression, which will otherwise be evaluated the same as the UNIX "expr" command does. (Note: other extensions could use arithmetic functions and similar operators). No blanks should separate the modes and operators unless the entire expression is enclosed in single quotes. Example: PROGRAM TESTBENCH 0 0 0 REQUIRED='FCH & TMD'.

A description of the detailed support for the new parent-child organization of the audit rule follows. The invention allows related PROGRAM, OBJECT, TASK, and INFO statements in the audit rule(s) 30 to be grouped together as in the LUF 36 for readability and usability. The audit rule(s) 30 are organized in the same manner as the LUF, by PROGRAM, then OBJECT within parent PROGRAM, then TASK and INFO within parent OBJECT. QM 50 now keeps track of these audit rule records in this order rather than sorting them. It is legal to have two or more PROGRAM, OBJECT, TASK, or INFO audit rule records with the same name but with different conditions. The order matters only when different conditions overlap.

QM audit program 50 initially forms a subset of the audit rule(s) for the current run by finding all records in the audit rule(s) whose conditions are true for this run (using the ProcessingModes input). If there are no conditions on an audit rule record, then that record is required by default and is included. If there are conditions specified, then the conditions must evaluate to true for the record to be included in the subset audit rule. For example, if a record has a PROHIBITED condition which is not true for the run, then this record is dropped. QM audit program 50 is careful to include child records (e.g., OBJECT records associated with a PROGRAM) if the combined parent/child conditions evaluate to true.

QM next compares the LUF and the subset audit rule. FIG. 7 describes the actions of the QM 50 with respect to conditions in the audit rule. Any missing or incorrect records in the LUF 36 will be reported as errors. QM 50 makes a pass through the LUF, matching each LUF record with its corresponding audit rule record by name. For INFO records with a character string value, the value is also included with the name when checking for a match. Each matching LUF record is then evaluated according to the conditions in the audit rule, and the statement type. The matching record in the audit rule is marked that it had a LUF record. If the LUF record does not match an audit rule record, an error message is written. When the LUF is completely processed, a pass is made through the audit rule, looking for statements which are REQUIRED in this run, but do not have a matching LUF record. Error messages are written for these. The only exception to the above process is for the first OBJECT record for a PROGRAM in the LUF. This OBJECT record will contain the name of the chip part number being processed, and is skipped by QM audit program 50.

A detailed description of the QM 50 support for checking of INFO statements in the LUF 36 using the audit rule 30 follows. The checking varies depending on the audit rule conditions and values to be checked. The audit rule INFO record allows for three variations on the value checking to be done.

First, if no value is specified for checking the infoName, no check is made on the value in the LUF 36. However, if the INFO is REQUIRED for this run, it must be present in the LUF. If the INFO is OPTIONAL for this run, no checking is done and there are no error messages. If it is PROHIBITED for this run, it must not be present in the LUF. An INFO record with no value and a true condition should appear only once in the audit rule(s) since QM will stop on the first match on INFO name. The following example from the FIG. 6 audit rule is a required entry in the FIG. 5 LUF, the value of which is not checked: INFO PART_NUMBER. The LUF 36 listing shown in FIG. 5 contains a legal record, INFO PART_NUMBER 06K6022.

Second, if the audit rule record for this infoName contains a value checking expression consisting of a decimal number preceded by one of these relational operators: >, <, >=, <=, =, !=, QM will conceptually put the value for this INFO from the LUF 36 on the left side of the operator and then check if the expression is true, using an arithmetic comparison. An INFO record with a numeric value and a true condition should appear only once in the audit rule(s) since QM 50 stops on the first match on infoName. If the INFO is REQUIRED for this run, it must be present in the LUF and the numeric value in the audit rule must match the numeric value in the LUF. If the INFO is OPTIONAL for this run, then if the INFO is present in the LUF, the numeric value in the audit rule must match the numeric value in the LUF. If the INFO is PROHIBITED for this run, it must not be present in the LUF. The following example from the audit rule will cause QM to check if the number in the LUF for the INFO TEST_COVERAGE is >=90. This is a check on the static wafer test coverage figure.
INFO TEST_COVERAGE_Wafer_STATIC >=90.
The LUF 36 in FIG. 5 shows a "passing" condition:
INFO TEST_COVERAGE_Wafer_STATIC 98.637550

Third, if the audit rule record for this infoName contains a value checking expression consisting of a character string with no embedded blanks that doesn't begin with the above relational operators or with the reserved strings: REQUIRED, OPTIONAL or PROHIBITED, QM will separate this string into individual values using the comma "," as a separator, for both the audit rule 30 (FIG. 6) and the LUF 36 (FIG. 5). QM 50 does a character comparison between each value in the LUF with each value in the audit rule string. The two values must match exactly. More than one INFO record in the audit rule with a true condition and more than one in the LUF 36 can have the same INFO name, if they have character values. If the infoName matches but the character value does not, QM 50 will act as if the infoName didn't match and go check the next INFO record. This is true only for character values.

The following example from OBJECT TESTMODE_LOGIC_ACH is identical in both the audit rule 30 and LUF 36. The "test function pin attributes" (TF_PIN_ATTRIBUTES) identify particular test function pins (clocks, scan inputs and outputs, etc.) to TestBench and to the manufacturing tester for use in generating and applying tests to the product.
INFO TF_PIN_ATTRIBUTE TB_LOGIC_ACH, TB_WRP_AC
QM treats this statement as if it were two INFO statements with just one character value on each.
INFO TF_PIN_ATTRIBUTE TB_LOGIC_ACH
INFO TF_PIN_ATTRIBUTE TB_WRP_AC If an audit rule INFO record is REQUIRED for this run, then it must be present in the LUF 36 with all values present on the audit rule record matching those in the LUF. In the above example, QM 50 will check that the character string in the LUF 36 for INFO TF_PIN_ATTRIBUTE is one of the two values. It will also check that all two values are present in the LUF on one or more INFO TF_PIN_ATTRIBUTE records.

Similarly, if an INFO record is PROHIBITED in this run, an error message is written if any of the character values on the record is present in the LUF. If an audit rule INFO record with character values is OPTIONAL, there are no messages for values in the audit rule which are either present or missing in the LUF.

The first record of the following example from the audit rule in FIG. 6 directs QM to write an error message if either the "BTV_DCS" or the "BTV_TDS" attribute is found in any INFO EXCLUDED_ATTRIBUTES LUF record (for the current PROGRAM/OBJECT). The second record allows other EXCLUDED_ATTRIBUTES to pass the check. The order of these 2 records in the audit rule must be as shown since there are no attribute values in the second record.
INFO EXCLUDED_ATTRIBUTES BTV_DCS, BTV_TDS PROHIBITED
INFO EXCLUDED_ATTRIBUTES OPTIONAL.

The LUF listing in FIG. 5 does not contain any of the prohibited fields, but does contain other EXCLUDED_ATTRIBUTES, which thus pass the check:
INFO EXCLUDED_ATTRIBUTES PERF, REPOWER, PINSWAP, M062

These statements are used to ensure that the attributes intended to be passed by TestBench to manufacturing test actually are passed through and are not inadvertently left out. These attributes cause manufacturing test to do special processing, such as for testing macros.

The present invention is primarily disclosed as a method. It will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a prerecorded disk or other similar computer program product, for use with a data processing system, could include a storage medium and program means recorded thereon for directing the data processing system to facilitate the practice of the method of the invention. It will be understood that such system and articles of manufacture also fall within the spirit and scope of the invention. CAD tools would include the method of the invention by providing an audit trail produced by these tools and have capability to query for processing modes which read the design and technology data files. There would be a program which read the audit trail and also read technology files such as our audit rules, containing conditional and value checking capability, as well as a processing modes file. The method generates an output audit report as to passing or failing of a design.

A representative hardware environment for practicing the present invention is depicted in FIG. 8. This illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate on a wiring interconnect design which is loaded also loaded onto the computer system.

While the invention has been described in terms of preferred embodiments, those skilled in the art will recognize that the invention can be practiced with modification within the spirit and scope of the appended claims.

What is claimed is:

1. A method of auditing a design process, said method comprising:

producing a library usage file for a step in a design process using design data; and performing an audit by reading said library usage file and an audit role into a quality monitor program, wherein said library usage file includes a first INFO statement that has a value which may be checked by said quality monitor program during said audit, and wherein said audit rule includes a second INFO statement which may include a value checking expression used by said quality monitor during said audit.

2. The method in claim 1, wherein said library usage file and/or said audit rule may include an OBJECT statement for a PROGRAM organized according to a parent-child relationship where said PROGRAM is said parent and said OBJECT statement is said child.

3. The method in claim 1, wherein said library usage file and/or said audit rule file may include third INFO statement for said OBJECT organized according to a parent-child relationship where said OBJECT is said parent and said third INFO statement is said child.

4. The method in claim 3, wherein said third INFO statement increases a reporting ability of said quality monitor program.

5. The method in claim 1, wherein said library usage file and/or said audit rule may include a TASK statement for an OBJECT organized according to a parent-child relationship where said OBJECT is said parent and said TASK statement is said child.

6. The method in claim 1, further comprising query for a processing mode for said design step using said design data and technology data;

wherein, said audit is performed by reading said library usage file, said processing mode, and an audit rule into a quality monitor program; and wherein, said report of errors in said library usage file is based on said audit rule and said processing mode.

7. The method in claim 1, wherein said audit rule may include a condition used by said quality monitor program to check said library usage file.

8. The method in claim 7, wherein said quality monitor program evaluates said condition using said processing mode to check said library usage file.

* * * * *